(12) United States Patent
Thuo et al.

(10) Patent No.: US 11,059,098 B2
(45) Date of Patent: Jul. 13, 2021

(54) DIRECT PRINTING AND WRITING USING UNDERCOOLED METALLIC CORE-SHELL PARTICLES

(71) Applicants: Iowa State University Research Foundation, Inc., Ames, IA (US); SAFI-Tech, Inc., Ames, IA (US)

(72) Inventors: Martin M. Thuo, Ames, IA (US); Christophe Frankiewicz, Boone, IA (US); Ian D. Tevis, Ames, IA (US)

(73) Assignees: SAFI-Tech, Inc., Ames, IA (US); Iowa State University Research Foundation, Ames, IA (US)

( * ) Notice: Subject to any disclaimer, the term of this patent is extended or adjusted under 35 U.S.C. 154(b) by 424 days.

(21) Appl. No.: 15/932,990

(22) Filed: Jun. 6, 2018

(65) Prior Publication Data

US 2018/0354037 A1 Dec. 13, 2018

Related U.S. Application Data

(60) Provisional application No. 62/603,776, filed on Jun. 9, 2017.

(51) Int. Cl.
| | |
|---|---|
| *H05K 3/12* | (2006.01) |
| *B22F 7/04* | (2006.01) |
| *B29C 64/135* | (2017.01) |
| *B22F 7/00* | (2006.01) |
| *B22F 1/02* | (2006.01) |

(Continued)

(52) U.S. Cl.
CPC ............... *B22F 7/04* (2013.01); *B22F 1/02* (2013.01); *B22F 7/004* (2013.01); *B22F 10/20* (2021.01); *B29C 64/135* (2017.08); *H05K 3/125* (2013.01); *B22F 2007/042* (2013.01); *B22F 2999/00* (2013.01); *B33Y 10/00* (2014.12); *H05K 2201/0254* (2013.01); *H05K 2203/128* (2013.01)

(58) Field of Classification Search
CPC .................................................... H05K 3/1241
USPC ........................................................ 101/491
See application file for complete search history.

(56) References Cited

U.S. PATENT DOCUMENTS

| | | |
|---|---|---|
| 4,042,374 A | 8/1977 | Rasmussen et al. |
| 4,153,156 A | 5/1979 | Seemann et al. |
| 4,273,827 A | 6/1981 | Sweeney et al. |

(Continued)

FOREIGN PATENT DOCUMENTS

| | | |
|---|---|---|
| EP | 3322549 A1 | 5/2018 |
| WO | WO-2015/089309 A1 | 6/2015 |
| WO | WO-2017/011029 A1 | 1/2017 |

OTHER PUBLICATIONS

"U.S. Appl. No. 14/999,868, Corrected Notice of Allowability dated Mar. 6, 2019", 2 pgs.

(Continued)

*Primary Examiner* — Anthony H Nguyen
(74) *Attorney, Agent, or Firm* — Schwegman Lundberg & Woessner, P.A.

(57) ABSTRACT

A method of direct printing or writing of a metallic material involves depositing, with a printing device or writing device, an ink comprising of at least undercooled liquid metallic particles dispersed in a carrier fluid. The ink is deposited on any substrate surface to deposit the undercooled liquid metal particles thereon as one or more layers that can form a desired pattern or layered structure.

44 Claims, 11 Drawing Sheets

(51) Int. Cl.
  B22F 10/20    (2021.01)
  B33Y 10/00    (2015.01)

(56) References Cited

U.S. PATENT DOCUMENTS

| | | | |
|---|---|---|---|
| 4,282,034 | A | 8/1981 | Smith et al. |
| 4,514,125 | A | 4/1985 | Stol |
| 4,519,866 | A | 5/1985 | Stol |
| 4,913,263 | A | 4/1990 | Spiers |
| 5,769,308 | A | 6/1998 | Kokusho et al. |
| 6,106,739 | A | 8/2000 | Stephens et al. |
| 10,124,310 | B2 | 11/2018 | Thuo et al. |
| 10,266,925 | B2 | 4/2019 | Thuo et al. |
| 2005/0250878 | A1 | 11/2005 | Moore et al. |
| 2007/0110913 | A1* | 5/2007 | Franchet ............... C04B 41/90 427/430.1 |
| 2008/0251164 | A1 | 10/2008 | Lohwongwatana et al. |
| 2009/0107550 | A1* | 4/2009 | Van Duren ......... C23C 18/1287 136/262 |
| 2009/0314390 | A1* | 12/2009 | Gigliotti, Jr. ........... F01D 5/288 148/284 |
| 2010/0216632 | A1 | 8/2010 | Adzic et al. |
| 2011/0220316 | A1* | 9/2011 | Fuqua ...................... B22C 1/04 164/456 |
| 2012/0067615 | A1 | 3/2012 | Blaiszik et al. |
| 2013/0244037 | A1 | 9/2013 | Hohman et al. |
| 2016/0317992 | A1* | 11/2016 | Thuo ................. B23K 35/0244 |
| 2017/0014958 | A1 | 1/2017 | Thou et al. |
| 2017/0120295 | A1 | 5/2017 | Thuo et al. |
| 2017/0219948 | A1* | 8/2017 | Chun ..................... G03G 9/122 |
| 2019/0203327 | A1 | 7/2019 | Thuo et al. |

OTHER PUBLICATIONS

"U.S. Appl. No. 14/999,868, Final Office Action dated Jul. 20, 2018", 11 pgs.
"U.S. Appl. No. 14/999,868, Non-Final Office Action dated Nov. 14, 2017", 12 pgs.
"U.S. Appl. No. 14/999,868, Notice of Allowance dated Dec. 12, 2018", 10 pgs.
"U.S. Appl. No. 14/999,868, Response filed Mar. 13, 2018 to Non-Final Office Action dated Nov. 14, 2017", 7 pgs.
"U.S. Appl. No. 14/999,868, Response Filed Sep. 11, 2018 to Final Office Action dated Jul. 20, 2018", 12 Pgs.
"U.S. Appl. No. 14/999,868, Response filed Oct. 27, 2017 to Restriction Requirement dated Sep. 1, 2017", 3 pgs.
"U.S. Appl. No. 14/999,868, Restriction Requirement dated Sep. 1, 2017", 10 pgs.
"U.S. Appl. No. 16/299,682, Supplemental Preliminary Amendment filed Jul. 9, 2019", 5 pgs.
"European Application Serial No. 16824809.4, Partial Supplementary European Search Report dated Jan. 4, 2019", 11 pgs.
"European Application Serial No. 16824809,4, Response filed Aug. 21, 2018 to Communication Pursuant to Rules 161(2) and 162 EPC dated Feb. 21, 2018", 14 pgs.
"International Application Serial No. PCT/US2016/000058, International Preliminary Report on Patentability dated Jan. 25, 2018", 10 pgs.
"International Application Serial No. PCT/US2016/000058, International Search Report dated Oct. 18, 2016", 4 pgs.
"International Application Serial No. PCT/US2016/000058, Written Opinion dated Oct. 18, 2016", 8 pgs.
Bowden, N., et al., "Mesoscale Self-Assembly: Capillary Bonds and Negative Menisci", J. Phys. Chem. B, 104, (2000), 2714-2724.
Bowden, N. B., et al., "Molecule-Mimetic Chemistry and Mesoscale Self-Assembly", Acc. Chem. Res., 34(3), (2001), 231-238.
Bowden, N., et al., "Self-Asembly of Mesoscale Objects into Ordered Two-Dimensional Arrays", Science New Series, 276(5310), (Apr. 11, 1997), 233-235.
Bowden, N., et al., "Self-Assembly of Microscale Objects through Lateral Capillary Forces", Langmuir, 17(5), (2001), 1757-1765.

Cadirli, E, et al., "The effect of growth rate on microstructure and microindentaiton hardness in the In—Bi—Sn ternary alloy at low melting point", Journal of Alloys and Compounds, 470(Issues 1-2), (2009), 150-156.
Dickey, M. D., "Emerging Applications of Liquid Metals Featuring Surface Oxides", Applied Materials & Interfaces, 6(21), (2014), 18369-18379.
Dickey, M. D, et al., "Eutectic Gallium-Indium (EGain) : A Liquid Metal Alloy for the Formation of Stable Structures in Microchannels at Room Temperature", Adv. Funct. Mater., 18(7), (2008), 1097-1104.
Ferguson, Gregory S, "Contact Adhesion of Thin Films on Elastomeric Supports: Cold Welding Under Ambient Conditions", Science, 253(5021), (1991), 776-778.
Gao, Fan, et al., "Effect of surface oxide on the melting behavior of lead-free solder nanowires and nanorods", Applied Surface Science, 258(19), (2012), 7507-7514.
Gao, Fan, et al., "Synthesis, Characterization, and Thermal Properties of Nanoscale Lead-Free Solders on Multisegmented Metal Nanowires", J. Phys. Chem.C, 113(22), (2009), 9546-9552.
Garnett, Erik C., et al., "Self-limited plasmonic welding of silver nanowire junctions", Nature Materials, 11(3), (Mar. 2012), 241-249.
Herlach, D. M., "Containerless Undercooling and Solidification of Pure Metal", Annu. Rev. Mater. Sci., 21, (Aug. 1991), 23-44.
Holland-Moritz, D, et al., "Short-range order of stable and undercooled liquid titanium", Materials Science and Engineering A vol. 449-451, (Mar. 25, 2007), 42-45.
Hutter, T., et al., "Formation of Spherical and Non-Spherical Eutectic Gallium-Indium Liquid-Metal Microdroplets in Microfluidic Channels at Room Temperature", Adv. Funct. Mater. 22(12), (2012), 2624-2631.
Ismagilov, Rustem F, et al., "Autonomous Movement and Self-Assembly", Angew. Chem. Int. Ed., 41(41(4), (2002), 652-654.
Kato, Hidemi, et al., "Surface-activated supercooled liquid brazing", Scripta Materialia, 68(9), (2013), 699-702.
Kim, Changsoon, et al., "Fabrication of Organo Light-emitting Devices by Low Pressure Cold Welding", Adv. Mater. Sci., 15(6), (2003), 541-545.
Koppes, J. P, et al., "Utilizing the thermodynamic nanoparticle size effects for low temperature Pb-fee solder", Materials Science and Engineering B, 177, (2012), 197-204.
Laza, S. C., et al., "Selective Cold Welding if Colloidal Gold Nanorods", Part. Syst. Charact., 30(7), (2013), 584-589.
Li, Xiaopeng, et al., "Nanwire Joining Methods", The Open Science Journal, 3, (2011), 91-104.
Lu, Yang, et al., "Cold Welding of ultrathin gold nanowire", Nature Nanotechnology, vol. 5, (Mar. 2010), 218-224.
Mullis, A. M., et al., "The solidification of undercooled melts via twinned dendritic growth", Materials Science and Engineering A, 375-377, (2004), 547-551.
Parravicini, G. B, et al., "Extreme undercooling (down to 90K) of liquid metal nanoparticles", Appl. Phys. Lett., 89, 033123, (2006), 3 pgs.
Patra, Debabrata, et al., "Fabrication of Conductive Microcapsules via Self-Assembly and Crosslinking of Gold Nanowires at Liquid-Liquid Interfaces", Small, 6(13), (2010), 1402-1405.
Peng, Yong, et al., "Bottom-up Nanoconstruction by the Welding of Individual Metallic Nanoobjects Using Nanoscale Solder", Nano Leltters, 9(1), (2009), 91-96.
Perepezko, J H, et al., "Undercooling and solidfication of atomized liquid droplets", Materials Science and Engineering, A326, sebright, (2004 144-153.
Perepezko, J. H., "Nucleation in Undercooled Liquids", Materials Science and Engineering, 65(1), (1984), 125-135.
Perepezko, J. H., et al., "Undercooling Behavior of Liquid Metals", Materials Research Society Symposia vol. 8, Symposium F—Rapidly Solidified Amorphous and Crystalline Alloys, (1982), 49-62.
Qi, W H, "Size and shape dependent melting temperature of metallic nanoparticles", Materials Chemistry and Physics 88, (2004), 280-284.

(56) References Cited

OTHER PUBLICATIONS

Shen, Lu, et al., "Nanoindentation study on creep resistance of SnBi solder ally with reactive nano-metallic fillers", Materials Science & Engineering, A, 561, Tan, (2013), 232-238.

Sivan, Vijay, et al., "Liquid Metal Particles", Adv. Funct. Mater. 23(2), (2013), 144-152.

Suganuma, Katsuaki, "Advances in lead-free electronics soldering", Current Opinion in Solid State and Material Science, 5(1), (2001), 55-64.

Sun, Z, et al., "The Application of Electron Beam Welding for the Joining of Dissimilar Metals: An Overview", J. of Material Processing Technology, 59(3), (1996), 257-267.

Tevis, I. D, et al., "Synthesis of Liquid Core-Shell Particles and Solid Patchy Multicomponent Particles by Shearing Liquids Into Complex Particles (SLICE)", Langmuir, 30, (2014), 14308-14313.

Thuo, M. M., et al., "Odd-Even Effects in Charge Transport acorss Self-Assembled Monolayers", J Am Chem Soc., 133(9), (2011), 2962-2975.

Wagle, Durgesh V., et al., "Cold welding: a phenomenon for spontaneous self-healing and shape genesis at the nanoscale", Materials Horizizon, 2, (2015), 157-167.

Weiss, E. A, et al., "Si/SiO2-Templated Formation for Ultraflat Metal Surfaces on Glass, Polymer, and Solder Supports: Their Use for Self-Assembled Monolayers", Langmuir, 23(19), (2007), 9686-9694.

Witusiewicz, V T, et al., "Thermodynamic re-optimisation of Bi—In—Sn system bsed on new experimental data", Journal of Alloys and Compounds, 428(Issues 1-2), Walter Eng. Library—Level S TN1 .J7, (2007), 115-124.

Wolfe. D. B., et al., "Mesoscale Self-Assembly: Capillary Interactions When Positive and Negative Menisic Have Similar Amplitudes", Langmuir, 196), (2003), 2206-2214.

Zhou, Y, et al., "From Microjoining to Nanojoining", The Open Science Journal, 3, (2011), 32-41.

Zuo, Yong, "Evolution of Microstructure Across Eutectic Sn—Bi Solder Joints Under Simultaneous Thermal Cycling and Current Sensing", Journal of Electronic Materials, 44(1), (2015), 597-603.

\* cited by examiner

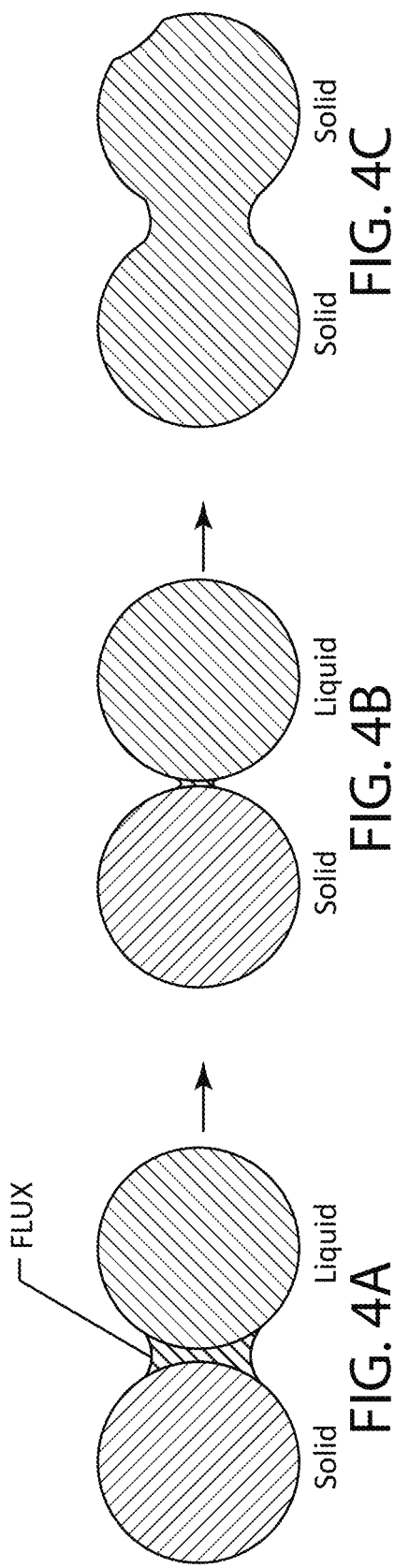
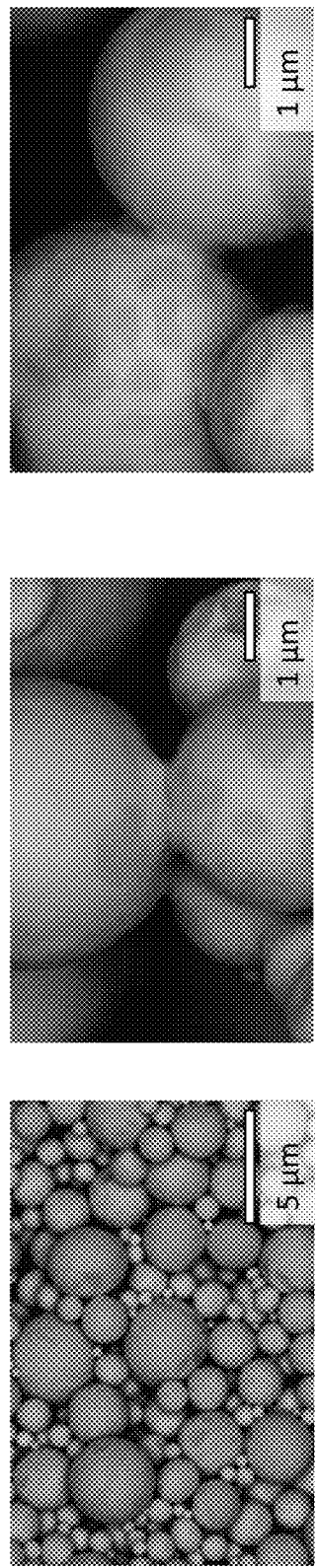
FIG. 4A  FIG. 4B  FIG. 4C
FIG. 4D  FIG. 4E  FIG. 4F

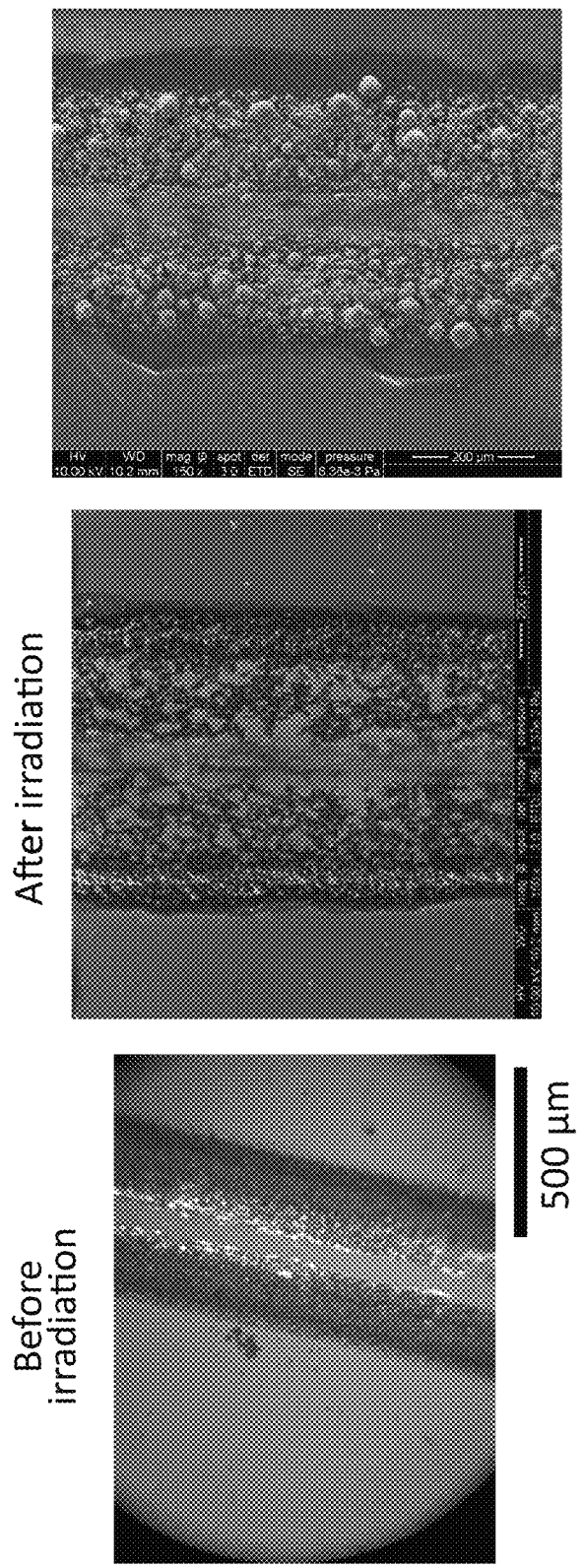

DIRECT PRINTING AND WRITING USING UNDERCOOLED METALLIC CORE-SHELL PARTICLES

RELATED APPLICATION

This application claims benefit and priority of provisional patent application Ser. No. 62/603,776 filed Jun. 9, 2017, the entire disclosure and drawings of which are incorporated herein by reference.

FIELD OF THE INVENTION

The present invention relates to direct printing and writing of metallic patterns and layered structures under ambient conditions using undercooled metallic core-shell particles.

BACKGROUND OF THE INVENTION

Additive manufacture (AM) is seen as the future of manufacturing because of its ability to rapidly create intricate 3D parts with little wasted material, together with a rapid turnaround and the possibility of designing unique, complex geometries. Used initially for rapid prototyping, commercial products based on AM and made from plastics, metals, and ceramics are now being sold. Even commercially available 3D-printers that exclusively build with one material type are available. In the last few years, additive manufacturing, commonly known as 3D printing, has exploded into public popularity. The ability to design and produce complete objects from a variety of low-cost plastics, has inspired a new generation of hobbyists seeking Do-It-Yourself (DIY) projects and entrepreneurs creating new businesses. And the most recent developments in 3D printing enable the combination of multiple plastics into a single product. However, there a vast, untapped potential these printers cannot access: multi-material production combining the tunable mechanical properties of plastics and the electronic capabilities possible through embedded circuitry. While metal 3D printers exist, they typically require powerful laser attachments or an arc welder to melt metal powders or filaments. These expensive, energy-intensive components keep printer prices high and present dangerous conditions for mass market appeal and for use in low resource settings. The most advanced breakthroughs in multi-material 3D printing technologies rely on metal-infused plastics (MIPs) or conductive silver inks (CSIs) as feedstocks for commercial 3D printers.

As the technology matures and becomes more widely available, there is an effort to print any object using multiple material classes that can have vastly different processing conditions and print strategies. Thermoplastics are seen as possible base materials for space platforms because of their stiffness-to-weight and dielectric properties, and metals can give electrical conductivity needed for embedded devices. Out of the many technologies for printing polymers and metals, extrusion and direct-write technologies have great potential to be combined into a multimaterial system to create unique functions such as a structural panel or electronics enclosure with integrated antennas, wiring, sensors, and/or heater elements. The direct deposition of conductive inks has found success in 3D printing, but the mechanical and electrical properties of these inks are less robust than solid metals.

Manufacture of flexible electronic devices involves the combination of substrates and electronic components to make products that are lightweight, energy efficient, wearable, stretchable, and flexible. However, during manufacture of flexible electronic devices significant temperature incompatibility of materials can be encountered. For example, primary materials used as substrates can be plastics and paper such that heating these and other affordable substrates can cause bending, discoloration, mechanical weakening, and coefficient of thermal expansion mismatch between components, all leading to cracking and electronic device failure.

Typical electronic components that are made of plastics, organic molecules, or contain liquid present manufacturing challenges when forming interconnects between the components and conductive traces on heat-sensitive substrates. Heat may cause components to lose their intended function. To limit heat damage, silver-based ink typically is applied to make conductive traces and interconnects. Flexible electronics manufacturers have several options to address the need for low-temperature processing of metals to form electrically conductive traces and interconnects: 1) reactive metal inks; 2) electrophoretic inks; 3) low melting solders; 4) conductive adhesives; and 5) nanosilver inks. The most promising technology so far involves nanosilver inks that can be cured at temperatures below 60 degrees C. However, their lower temperature processing comes with a trade-off in processing time wherein long heating times of conductive inks at low temperatures creates bottlenecks in processing, reducing inherent advantages of use of such conductive inks. None of these current technologies meets the production needs for low-temperature, rapid, conductive, printable, reliable, and affordable manufacture of flexible electronic devices. Moreover, removing the need for heating from the formation of conductive traces and interconnects can give manufacturers more freedom to select materials and components as well as accommodate more flexible process strategies for developing and commercializing flexible electronics technologies.

The present invention seeks to address these needs and to overcome the need for high temperature curing or long time curing at low temperatures.

SUMMARY OF THE INVENTION

To this end, the present invention provides in an illustrative embodiment a method of direct printing or writing of a metallic material by using under ambient conditions a printing device or a writing device to deposit an ink comprising undercooled liquid metallic core-shell (LMCS) particles dispersed in a carrier fluid on the substrate surface as one or more layers. The substrate surface and the printing or writing device carrying the ink can be relatively moved to deposit the undercooled liquid metallic core-shell particles on the substrate surface. The substrate can comprise a surface on any type of substrate including, but not limited to glass, polymers, metals, ceramics, and others.

In another illustrative embodiment of the invention, the method involves the additional step during or after deposition of the LMCS particles of releasing the liquid metallic core material of the particles and solidifying the released liquid metallic material as one or more metallic layers on the substrate surface.

In certain illustrative embodiments of the invention, the one or more deposited metallic layers is/are electrically conductive and/or thermally conductive. The one or more deposited metallic layers can be continuous, discontinuous and porous. The one or more deposited metallic layers can be deposited in a pattern to form one or more straight or curvilinear electrically or thermally conductive lines that can be laterally spaced apart on the substrate surface, such as orthogonally positioned relative to one another and/or intersecting one another at an angle for use with electrical or other components.

The present invention further envisions a substrate having a surface on which a layer comprising undercooled liquid metallic core-shell particles is printed or written using ink containing the particles. The deposited interconnected undercooled liquid metallic core-shell particles can be ruptured to provide a flexible, electrically conductive layer comprising ruptured, electrically solid metal on the surface. The substrate can be part of a light emitting diode (LED) display, microelectromechanical systems (MEMS) device, capacitive touch senor, Wheatstone bridge, or any other electronic device.

The present invention is advantageous and possesses broad utility, which for purposes of illustration and not limitation, can range from printed and flexible electronics (e.g. to print metallic conductive lines and interconnects on paper, polyimide tape, biopolymers or elastomers) to direct writing and additive manufacturing of metals for parts and structural components. Moreover, practice of the present invention is advantageous to produce a continuous thin electrically conductive metallic film, instead of an aggregate of conductive particles, increasing electrical properties and mechanical robustness with lower processing temperatures as compared to silver inks and higher operating temperature compared to liquid gallium indium (GaIn) inks.

Other advantageous and benefits of the present invention will become apparent from the following detailed description taken with the following drawings.

BRIEF DESCRIPTION OF THE DRAWINGS

FIG. 2A shows a rollerball pen containing a suspension of LMCS particles in a hydroxyethyl cellulose solution in ethanol/water ready for writing on the paper; FIG. 2B is a schematic of this direct write method; FIG. 2C is a light microscopy image at low magnification of the written dry ink line; FIG. 2D is a higher magnification image of the ink line showing the particles and some pressed particles under the rollerball of pen; FIG. 2E illustrates a rollerball pen for particle pressing; FIG. 2F shows use of an empty rollerball pen to press and fracture the particles to create electrically conductive line pathways by solidification of the liquid metal core material on the paper; FIG. 2G is a low magnification light microscopy image of the shiny pressed particles; and FIG. 2H is a high magnification light microscopy image of the shiny pressed particles pressed into continuous and conductive lines.

FIG. 4A schematically illustrates a solid LMCS particle in a liquid particle matrix wetted by chemical flux; FIG. 4B shows drying action of the flux pulling the particles together; FIG. 4C shows flux dissolving oxide shells; FIG. 4D is top-down SEM micrograph of LMCS particles after flux action showing dimples formed after solidifying; and FIGS. 4E and 4F show SEM micrographs of joined particles that resemble the schematic of FIG. 4C.

FIG. 7A shows an LMCS particle-containing line deposited by the craft-cutter before laser irradiation, while FIGS. 7B and 7C show the lines after laser irradiation used as the source of the fracturing shown in the figures.

FIG. 8A shows a photograph of the particle lines produced very fast, fast, and slow speeds left-to-right.

DESCRIPTION OF THE INVENTION

In certain illustrative embodiments of the invention, deposition of ink containing a suspension of the undercooled (supercooled) metastable liquid metallic core-shell (LMCS particles) on the substrate can be achieved by either using a writing device including, but not limited to, a rollerball or ball point pen, felt tip, quill or other similar manually manipulated writing device or a printing device including, but not limited to, offset lithography, flexography, inkjet, xerography, letterpress, gravure, screen printing, or similar printing device.

Figure 1A:
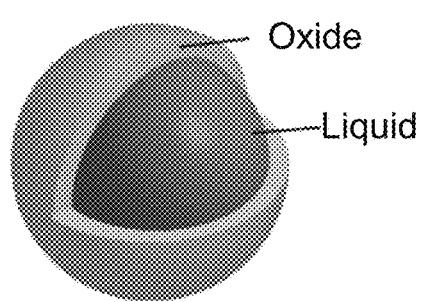
FIG. 1A shows a schematic view of an LMCS particle and FIG. 1B shows a scanning electron micrograph (SEM) image of actual LMCS particles.
Figure 1B:
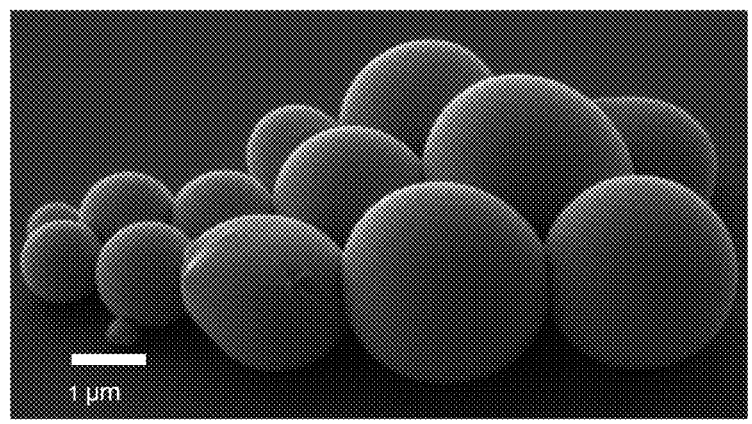

Printing or writing ink pursuant to embodiments of the invention can comprise the LMCS particles dispersed in any suitable carrier liquid to provide a printable or writable suspension. For purposes of illustration and not limitation, the metastable, undercooled (supercooled) liquid metallic core-shell (LMCS) particles can be selected from any suitable metallic material that can be undercooled by the SLICE process or other process to a metastable state having a liquid metallic core contained within a protective shell. Illustrative LMCS particles are shown in FIGS. 1A, 1B. The SLICE process is described by I. D. Tevis et al., Langmuir 2014, 30, 14308 and by WIPO WO/2015/089309 published June, 2015, the disclosures of which are incorporated by reference herein to this end.

The carrier liquid can include, but is not limited to, water, alcohol such as ethanol, ethylene glycol, cellulose base liquid, or combinations of analogous systems to give the desired viscosity. The amount of the LMCS particles in the carrier liquid can be varied as desired to provide a suitable ink viscosity and other properties for a particular printing of writing application. Amounts of the LMCS particles from 5%, 10%, 15%, and 45% by weight in ethylene glycol and 80% by weight in a mixture of ethanol and ethylene glycol can be used for purposes of illustration and not limitation. In certain illustrative embodiments of the invention, in addition to the LMCS particles, an amount of hydroxyethyl cellulose (HEC), such as 2 weight % HEC, can be present in a 1:1 mixture of water and methanol and/or ethanol as the carrier liquid to provide 75 weight % Field's metal particles in the suspension (ink). The viscosity, drying time, etc. of the ink used in practice of the invention can be selected to be compatible with the viscosity, drying time, etc. of the default ink (original equipment ink specifications) of the writing or printing device to be employed.

For purposes of illustration and not limitation, the ink containing the LMCS particles can have a viscosity of 1000 to 10,100 cP for mechanical writing applications, 10-14 cP for inkjet printing applications, and 0.7 to 2500 cP for aerosol jet printing applications.

The suspension of LMCS particles in the carrier liquid is made by mixing particles with hydroxyl cellulose solution, although any suitable mixing technique can be used.

The substrate surface can comprise a surface on any type of substrate material including, but not limited to paper material, tape material, glass material, thermoplastic or thermosetting polymer material, gel material, metallic material, ceramic material, composite material, crystalline material, amorphous material, porous material, fibrous material, composite material, thin film material, and any other material. For purposes of illustration and not limitation, substrate surfaces on which LMCS particle have been printed or written pursuant to exemplary embodiments of the invention include printing paper, tracing paper, filter paper, PTFE sheet, transparent polypropylene sheet, polyimide tape, cardboard, and glass slides.

The rate of deposition as well as the concentration of the LMCS particles in the ink can be precisely controlled to adjust the thickness, the smoothness, and the electrical property (e.g. electrical resistivity) of the metallic pattern or layered structure produced. The deposition can be combined with a chemical flux application to further control the properties of the resulting layers/structures.

After or during deposition, the liquid metallic core material of the LMCS particles is released and solidified as one or more metallic layers on the substrate surface.

In certain illustrative embodiments of the invention, the undercooled LMCS particles can be mechanically fractured using mechanical forces (e.g. shear force or compression force exerted by e.g. a rollerball pen rolling on the particles), physical forces (e.g. a laser impingement) to produce the thin metallic layer, or using chemical action such as a flux to remove at least a portion of the shell of the particles.

The fracture force can be applied to the particles using the printing device or the writing device or using a tool that is not limited to a roller, a press, and a blunt object.

Release of the liquid metallic core material can be achieved using other means including, but not limited to, light impingement such as laser light impingement or focused beam light impingement, ultrasound impingement, vibrational forces, and heat application to remove at least part of the oxide shell of the particles. For example, certain particular illustrative embodiments of the invention envision use of the undercooled particles that comprise a metal alloy formulated into a 3D-printable ink for deposition and for activation using a chemical flux or laser impingement that can directly activate the undercooled particles to release the liquid core for solidification on the substrate to thereby write solid electrically and/or thermally conductive metallic lines onto thermoplastic or any substrate material.

The following examples are offered for purposes of illustration and not limitation to describe embodiments of the invention:

EXAMPLES

LMCS Particles:

The metastable, undercooled (supercooled) liquid metallic core-shell (LMCS) particles can be selected from any suitable metallic material that can be undercooled by the SLICE process or other process to a metastable state having a liquid metallic core contained within a protective solid shell. The SLICE process is described by I. D. Tevis, L. B. Newcomb, and M. Thuo in Langmuir 2014, 30, 14308, the disclosure of which is incorporated by reference herein to this end.

Such metallic materials include, but are not limited to, Field's metal (Bi:In:Sn 32.5:51:16.5 weight %; melting point-about 62° C.).; a Bi—Sn alloy (Bi:Sn:58:42 weight %; melting point about 139° C., Rose's metal (Bi:Pb:Sn 50:25:25 weight %; melting point-about 98° C.), and others.

The LMCS particles are made in the examples set forth below by the SLICE process, which is an extension of droplet emulsion technique (DET), although the particles can be made by other techniques. The SLICE process involves shearing a low $T_m$ (melting point) molten metal or alloy in the presence of a carrier fluid together with chemical reaction to produce liquid metallic core-shell nano-particles or micro-particles. The chemical reaction typically involves oxidation of the molten metal or alloy droplets in a manner to form an outer shell in-situ on the liquid metallic core. Moreover, the outer shell can be functionalized with an organic moiety, such as acetate or phosphate.

For purposes of illustration and not limitation, the examples described below employ Field's Metal (FM) LMCS particles made by shearing Field's metal in acetic acid-diethylene glycol solution. In a typical synthesis, one gram of Field's metal is placed into a vial containing 5 ml of 5% v/v acid solution. The vial was then heated using an oil bath (heating tape can also be used) to about 160° C. A Teflon head (described in SLICE) attached to the rotary tool was used to shear the mixture. The shearing was performed for 10-15 minutes and then solution was allowed to cool at room temperature. The particles were then filtered through filter paper and rinsed in ethanol. The FM LMSC particles have a size in the range of 0.5 to 15 µm in diameter, but the size can be tuned as desired by changing the shear stress, shear time, solvent or temperature ranges.

Example 1

Mechanical Direct Writing

Figure 2D:
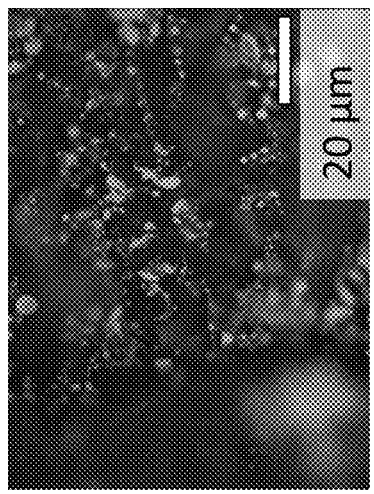
FIGS. 2A-2H illustrates a type of direct writing of conductive lines on paper where
Figure 2H:
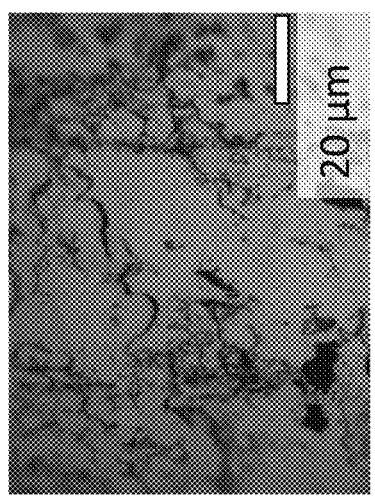
Figure 2C:
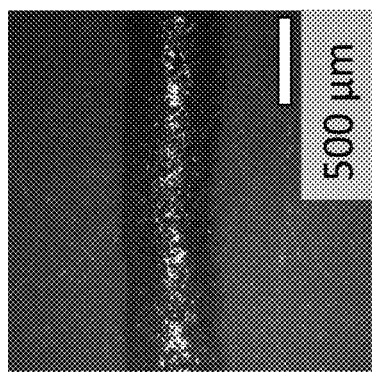
Figure 2G:
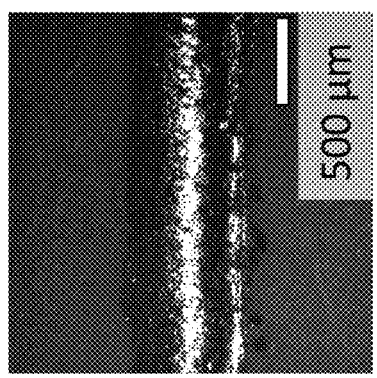
Figure 2B:
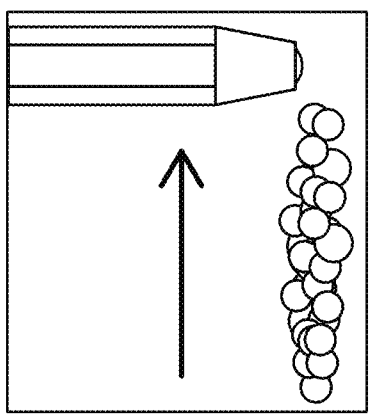
Figure 2F:
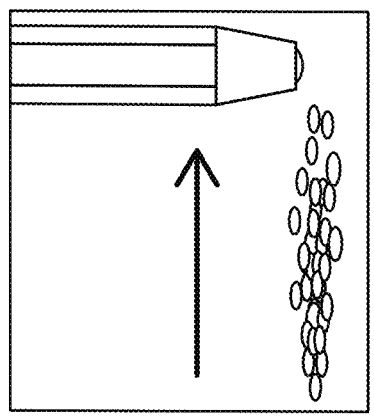
Figure 2A:
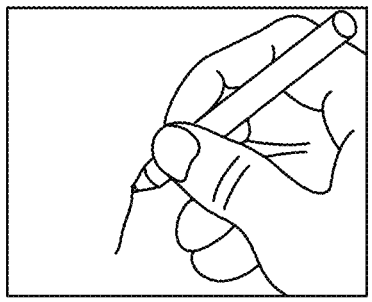

Referring to FIGS. 2A-2H, the direct writing of conductive lines on a sheet of paper is illustrated. FIG. 2A shows a rollerball pen containing ink [a suspension of LMCS particles in a hydroxyethyl cellulose solution in ethanol/water (5-60 weight % FM LMCS particles)] that has been substituted for the conventional ink in the commercially available rollerball pen.

FIG. 2B is a schematic of the direct write method where the human user manually moves the rollerball pen on the sheet of paper to form a straight ink line.

FIG. 2C is a light microscopy image of the written dry ink line at low magnification.

FIG. 2D is a higher magnification image of the ink line showing the particles and some pressed particles under the rollerball of pen.

Figure 2E:
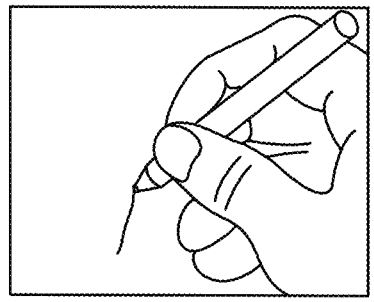

FIG. 2E illustrates a rollerball pen for particle pressing, and. FIG. 2F shows use of the empty pen to press, flatten, and fracture the particles to create electrically conductive line pathways by solidification of the liquid metal core material on the paper.

FIG. 2G is a low magnification light microscopy image of the shiny pressed particles, while FIG. 2H is a high magnification light microscopy image of the shiny pressed particles pressed into continuous and conductive lines.

A conventional voltmeter was attached by alligator clips to the ends of the ink line to measure electrical resistance. The pressed ink line exhibited low resistance, which was preserved even after folding of the sheet of paper on which the ink line was deposited.

In other similar direct writing examples, the LMSC particle-containing ink was prepared to contain 75 weight % Field's metal particles by preparing a 1:1 mixture of water and methanol. 2% hydroxyethyl cellulose (HEC) was dissolved in the solution while stirring at 70 degrees C. until the liquid was transparent. The solution then was cooled to room temperature. The 75 weight % Field's metal ink was then created by adding the cellulose solution into Field's metal particles (1:4 ratio of cellulose to Field's metal). The suspension was then mixed using a Fisher touch-mixer.

These other direct writing experiments produced results similar to those described above with respect to capability of printing complex patterns and shapes and different line thicknesses on different substrates such as cardboard, Kapton tape, and glass without heating or curing.

Example 2

Inkjet Printing

A commercial ink jet printer (HP Deskjet 6540 printer) was used to print straight and curvilinear lines of different thickness on a sheet of 8.5×11 in. letter paper.

The black ink cartridge of the ink jet printer was filled with ink comprising a solution of water/diethylene glycol/ethanol and LMCS particles in an amount of 5-60 weight % of the suspension (ink) and inserted into the cartridge location of the printer.

Figure 3B:
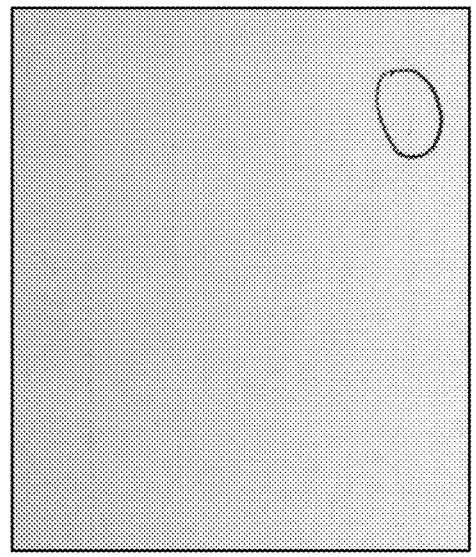
FIGS. 3A and 3B illustrate printing of lines of different thickness on letter paper using a craft-cutter as a printer.
Figure 3A:
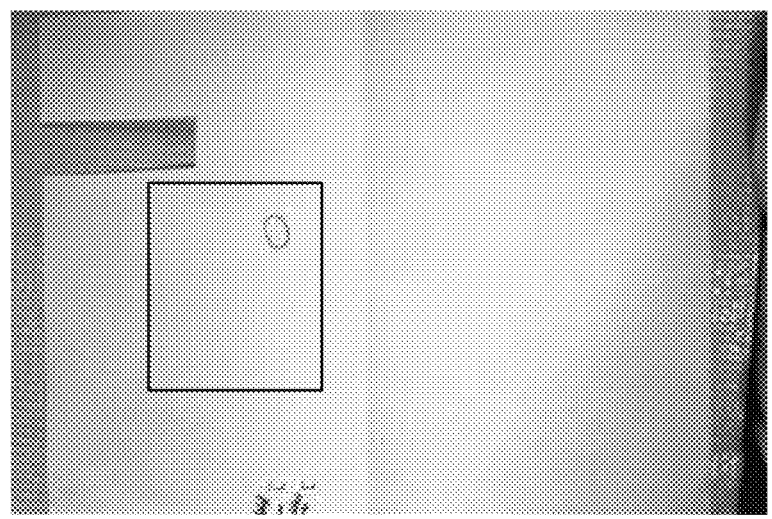

FIGS. 3A, 3B show the ink lines intentionally printed with different thicknesses by using more passes of the printing head over the same locations on the substrate.

The printer head of the inkjet printer, or any other printer, for that matter, can include a tube that communicates with a pump to provide a microfluidic ink delivery system. A flow focus nozzle can be attached to the tube as well.

A chemical flux such as $HCl_{(aq)}$ can be deposited concurrently with the LMCS particles to provide a flux action to release the liquid metallic core material during and/or after deposition on the substrate surface.

For example, referring to FIGS. 4A-4F, the joining and solidification of LMCS particles during chemical flux action is illustrated. FIG. 4A schematically illustrates a solid LMCS particle in a liquid particle matrix wetted by chemical flux. FIG. 4B shows a drying action of the flux pulling the particles together. FIG. 4C shows flux dissolving the oxide shells of the particles. FIG. 4D is top-down SEM micrograph of LMCS particles after flux action showing dimples formed after solidifying. FIGS. 4E and 4F show SEM micrographs of joined particles that resemble the schematic of FIG. 4C.

Figure 5:
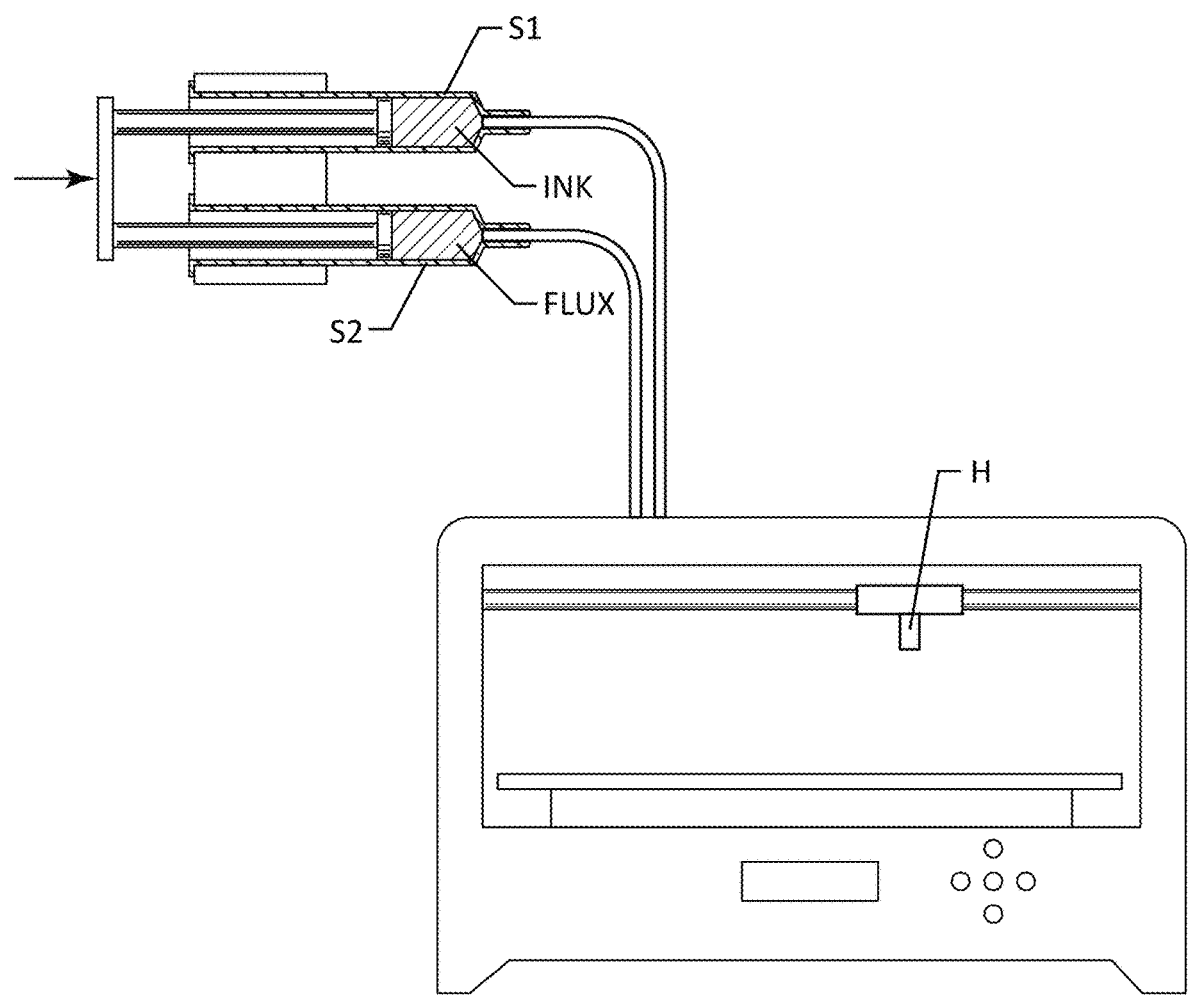
FIG. 5 is a schematic of a direct write printing device that includes double barrel syringe system to deliver the LMCS particle-containing ink and a chemical flux concurrently onto a substrate surface to print lines without heating.

The inkjet printer, or any other printer for that matter, can be modified to deliver the ink and the flux concurrently using for example a double barrel syringe system where one syringe supplies the ink pursuant to the invention and the other syringe supplies the flux to the same or different printing heads. FIG. 5 illustrates a schematic view of a direct-write system that includes the double barrel syringes S1 and S2 for delivery of ink and flux, respectively, to a print head H to this end.

Example 3

Craft Cutter Printing

A commercial craft cutter (Cameo Silhouette® craft cutter) was used to print patterns on different substrates.

The pen of the printer cutter was filled with ink comprising a solution of LMCS particles in an amount of 5-60 weight % suspended in hydroxyl-ethyl cellulose and inserted into the pen location of the printer cutter. The printer cutter was controlled to produce the patterns and lines shown in FIG. 6A-6E.

Figure 6D:
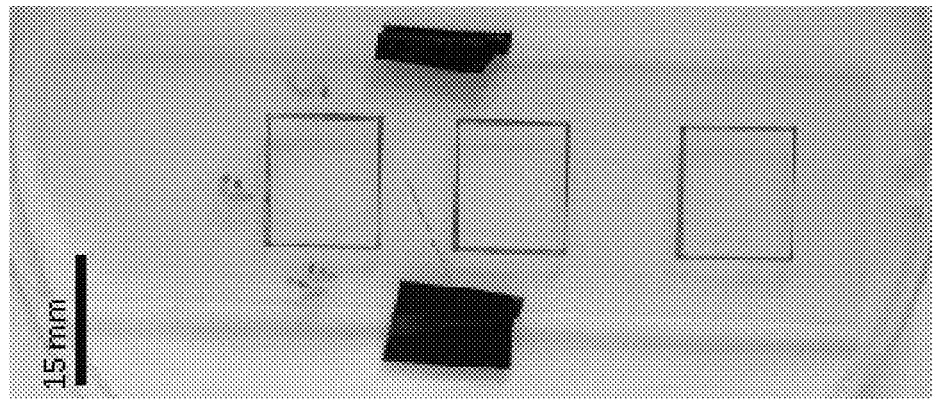
FIGS. 6A-6E illustrate patterns printed on different substrate surfaces using a modified craft cutter.
Figure 6B:
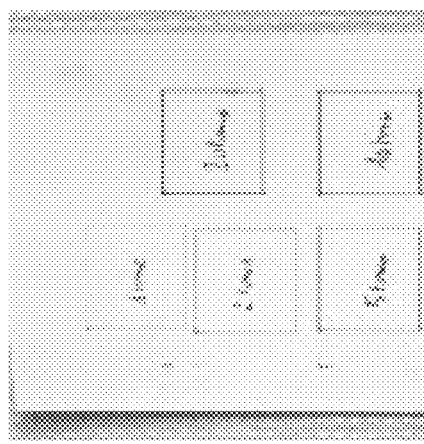
Figure 6E:
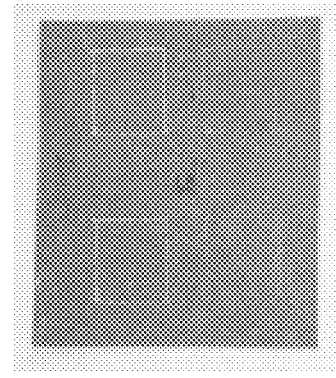
Figure 6A:
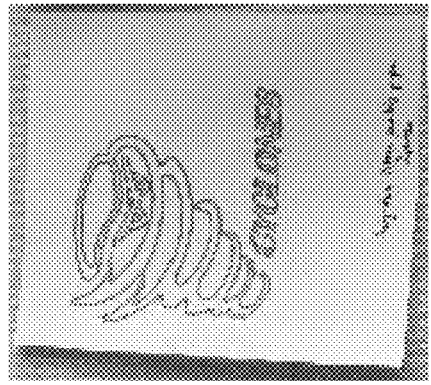
Figure 6C:
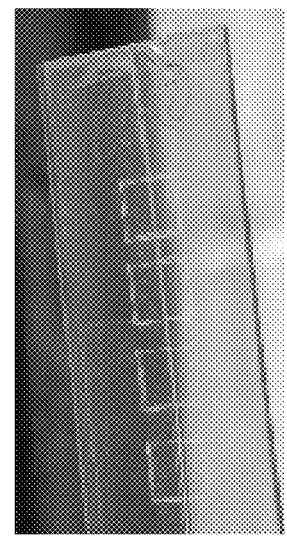

FIG. 6A shows a "cyclone" logo of Iowa State University printed on paper. The printed dry logo was then pressed using a mechanical rolling press to ensure that uniform shear stress was applied on the Field's metal LMSC particles to release and solidify the liquid alloy core. FIG. 6B shows geometric patterns (rectangles) having printed lines of different thicknesses on paper. FIG. 6C shows geometric patterns (rectangles) having printed lines of same thicknesses on Kapton tape FIG. 6D shows geometric patterns (rectangles) having printed lines of the same thickness on glass. FIG. 6E shows geometric patterns (rectangles) of different thickness on cardboard.

The mechanical flexibility and durability of the direct-written dry, pressed lines were investigated by performing a bend tests at room temperature. All tested lines were drawn with a 960 µm roller ball pen on Neenah card stock paper (width=0.5 mm; height=about 10 µm; length=45 mm). The paper was bent between flat and bent states using a linear actuator at a rate of 1 bend cycle per second to three different bend radii of 3 cm to 0 cm. The electrical resistance of the conductive lines was measured every 500 cycles up to 10,00 cycles. The results indicate that the conductive lines are flexible and can survive uncracked for up to 10,000 cycles.

Example 4

Laser Direct Write

A direct print laser system can be used to print patterns, lines or other features on a substrate surface. The laser used comprised a 30W diode laser (445 nm) available from USA Laser. The laser movement is guided by a 4-axis stage (three translations and one rotation) and can be used to precisely (about 1 micron) control the position of the laser to disintegrate or join the LMCS particles deposited on and covering the whole glass slide.

FIG. 7A shows a light microscopy image of a line printed on a glass substrate by the craft-cutter of example 3. The centerline of the line is devoid of LMCS particles since that location is where the pen ball contacted the substrate surface. The edges adjacent to the centerline show shiny fractured, solidified particles as a result of pen movement along the printed line.

In comparison, FIGS. 7B and 7C are SEMs of the same craft-cutter printed line after laser irradiation in a separate step along the edges of the centerline to fracture the LMCS particles to release and solidify the metallic core material at the edges.

Another illustrative embodiment of this example envisions depositing the ink containing the LMCS particle over the entire surface of a substrate, removing the carrier liquid by drying, and then traversing a laser beam in a pattern or line(s) over the LMCS particles using the laser system described above to rupture the particle shells and release the liquid metallic core material to solidify on the surface as a metallic pattern or line(s). The un-ruptured LMCS particles then can be removed by washing, gravity (flipping upside down) or any other appropriate method leaving the pattern or line(s) on the substrate surface.

Figure 8A:
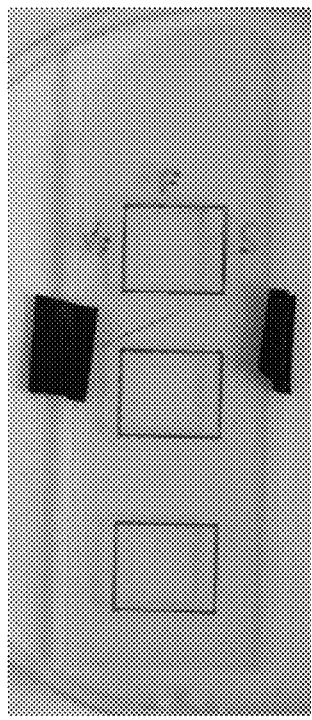
FIGS. 8A-8D show laser irradiated LMCS particle lines on a glass substrate using very fast (VF) (FIG. 8B), fast (F) (FIG. 8C), or slow (S) (FIG. 8D) laser beam traversing velocity.
Figure 8D:
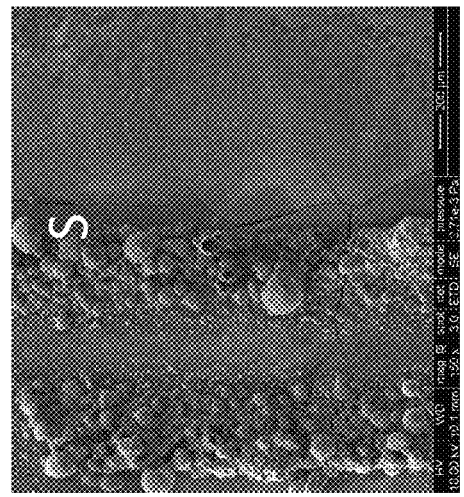
Figure 8C:
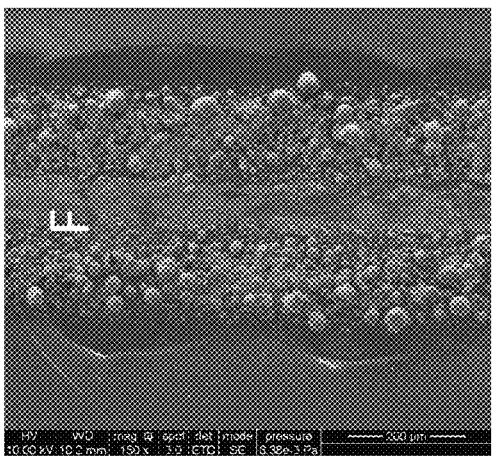
Figure 8B:
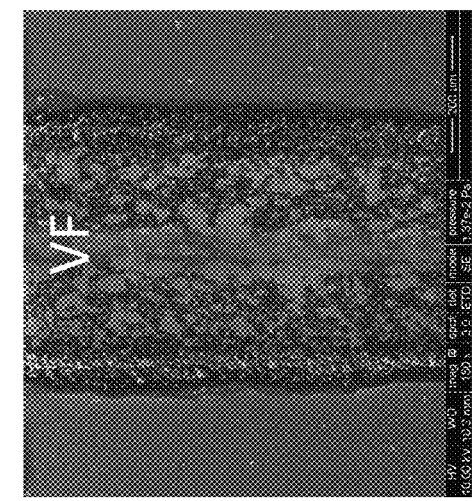

By controlling the velocity of the laser beam movement, (linked to the power of the laser), the LMCS particles can be joined together as shown in FIG. 8A and in FIG. 8B (very fast VF-about 1 cm/s)), FIG. 8C (fast F-about 1 mm/s), and FIG. 8D (slow S-multiple irradiation on the same location). The very fast (VF) beam movement results in joining of the LMCS particles, while the slow (S) beam movement results in disintegration of the LMCS particles.

Example 5

Screen Printing

In this example, the 75 weight % Field's metal LMCS particle-containing ink described above was used in screen printing examples wherein screen printing films (screens) were acquired from Novacentrix and PowerFilm. The printing process using these films was conducted manually.

Figure 9A:
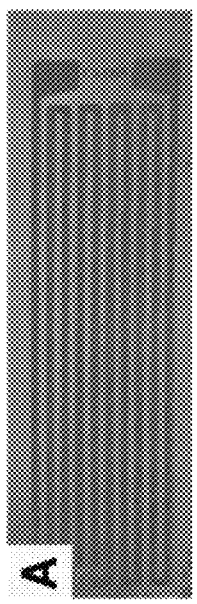
FIG. 9A is an image of the application side of a screen printing film purchased from Novacentrix.
Figure 9B:
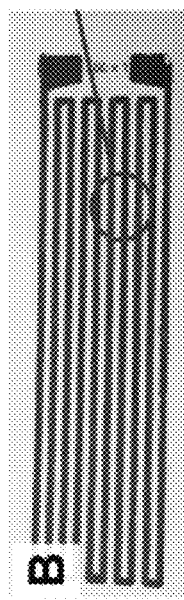
FIG. 9B is an image of an actual screen printing made on a paper substrate using Field's metal LMSC particle-containing ink and using the screen of FIG. 9A.
Figure 9C:
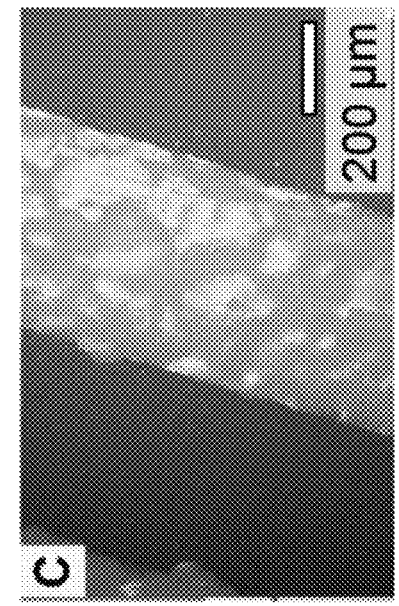
FIG. 9C is a light microscopy image of one of the screen-printed lines indicating that the screen-printed line is clean and sharp.

FIG. 9A shows an image of the application side of the screen purchased from Novacentrix. FIG. 9B is an image of an actual screen printing made on a paper substrate using the Field's metal LMCS particle-containing ink transferred using the screen of FIG. 9A. FIG. 9C is a light microscopy image of one of the screen-printed lines which line shown to be clean and sharp.

Figure 9D:
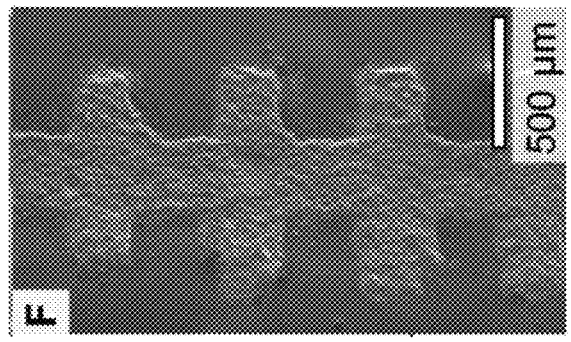
FIG. 9D is the application side of a film loaned from PowerFilm.
Figure 9E:
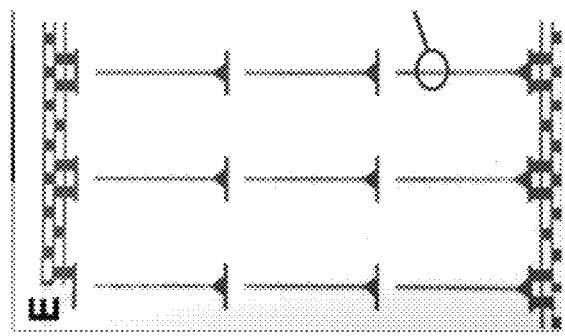
FIG. 9E shows an actual screen printing line made on a paper substrate made using the screen of FIG. 9D and using the same Field's metal LMSC particle-containing ink.
Figure 9F:
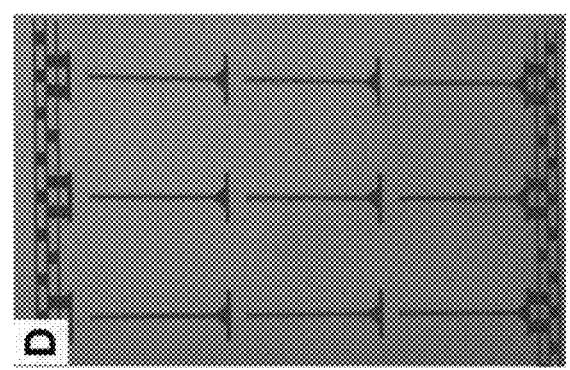
FIG. 9F is a scanning electron microscope (SEM) image of an as-screen printed line with a 240 μm feature size.

FIG. 9D show the application side of the screen purchased from PowerFilm. FIG. 9E shows an actual screen printing transferred on a paper substrate using the same Field's metal LMCS particle-containing ink and using the screen of FIG. 9D. FIG. 9F is a scanning electron microscope (SEM) image of a screen-printed line with a 240 μm feature size.

The screen printings transferred onto the paper substrate were observed to retain the original liquid core-shell structure of the Field's metal LMCS particles. The screen printings then can be pressed either manually or using a mechanical roller to form a layer or line that is continuous, electrically conductive, and solid after solidification of the liquid core alloy, all without heating or curing.

Example 6

Application of LMSC Flexible Conductive Lines (Traces) for LEDs

This example demonstrates practice of an embodiment of the invention to direct write a flexible, electrically conductive line or trace in the fabrication of an LED display on a paper substrate.

Figure 10A:
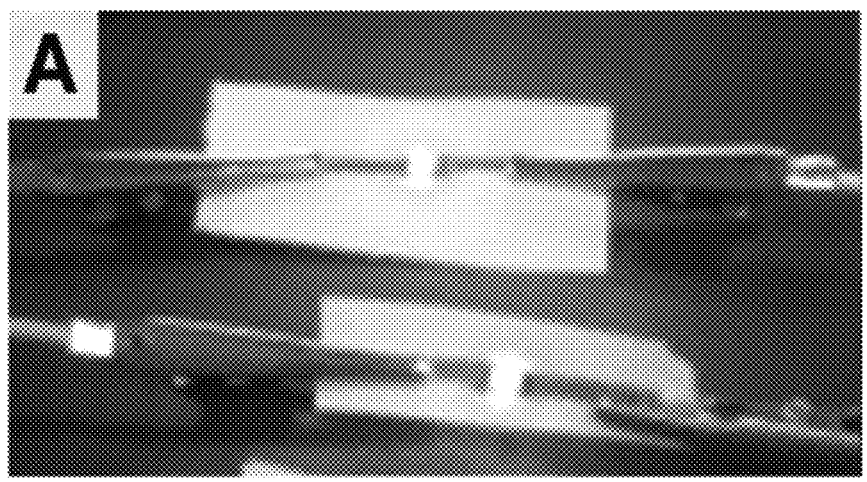
FIG. 10A is an image of functional LED devices made on paper using direct written Field's metal LMSC particle-containing ink for conductive interconnects and traces.

In particular, this example involved fabrication of a functional LED on a paper substrate by first writing a single LED conductive lines on a flexible paper substrate, FIG. 10A. The 75 weight % Field's metal LMSC particle-containing ink described above was used in this example and loaded into a conventional rollerball pen. The conductive line was drawn using the rollerball pen and then pressed with an empty roller ball pen to release and solidify the liquid alloy core material of the Field's metal LMSC particles as a conductive line on the paper substrate.

A surface mount LED then was connected to the LMSC particle conductive line by adding more of the LMSC particle-containing ink pressed on each contact to ensure consistent connection and then secured with superglue on the paper. The ends of the conductive lines were each connected to a 9V battery as a power source.

The LEDs were energized and emitted light immediately upon connection of the conductive lines to the battery, indicating that the conductive line was continuous and provided current flow through the LEDs. The LEDs remained energized even when the paper substrate was bent on itself evidencing flexibility of the LMSC solidified particle conductive line.

Example 7

4×4 LED Matrix

This example demonstrates practice of an embodiment of the invention to direct write flexible, electrically conductive lines or traces in the fabrication of a 4×4 LED matrix display on a paper substrate.

In particular, four cathode lines were drawn on paper using a rollerball pen filled with the 75 weight % Field's metal LMSC particle-containing ink described above. Anodes were made by drawing a conductive line on paper, cutting it out with a razor and gluing it over the cathode lines. That is, the conductive lines on this matrix were crossed by small paper strips with a single conductive line that acts as the respective anode, all of which were attached to the circuit using superglue.

After the grid was made, the terminals were drawn on the paper so that each LED shared an anode and a cathode with three others. The LEDs were then attached to the terminals using a small drop of super glue and a sample of the Field's metal particle-containing ink before pressing the component into each connection. The LED matrix was then connected to the Arduino Uno R3 microcontroller firmware which can configure the light output of the device.

Figure 10B:
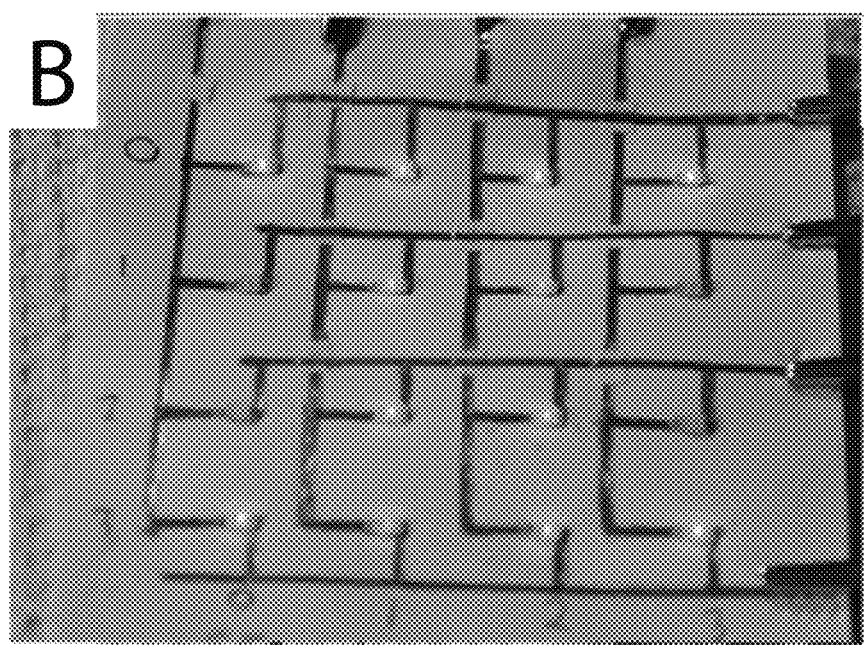
FIG. 10B is an image of a functional LED 4×4 matrix made on paper using direct written Field's metal LMSC particle-containing ink for conductive interconnects and traces.

A fully functional 4×4 LED matrix was thereby fabricated on a paper substrate, FIG. 10B.

Example 8

USB Keyboard Capacitive Touch Sensor

This example demonstrates practice of an embodiment of the invention to direct write electrically conductive touch sensor pads and lines of a USB keyboard capacitive touch sensor. The sensor touch pads and lines of the sensing circuit were fabricated on paper using the 75 weight % Field's metal LMSC particle-containing ink deposited by a rollerball pen and mechanically pressed by an empty rollerball pen. The LMSC conductive lines of the sensing circuit were connected in series to a respective microcontroller pin and sensor pad. Alligator clips were used to wire the sensing circuit on the paper to an Arduino model Uno R3 microcontroller that used software were obtained from the Arduino code library.

The capacitive touch sensor fabricated as described above was capable of detecting pressure; that is, the Arduino microcontroller was able to detect input upon the pressing of the touch sensor pad.

Example 9

MEMS Device

This example demonstrates practice of an embodiment of the invention to direct write electrically conductive contact pads of a piezo-resistive microelectromechanical (MEMS) force-sensing device on a paper substrate.

Figure 11A:
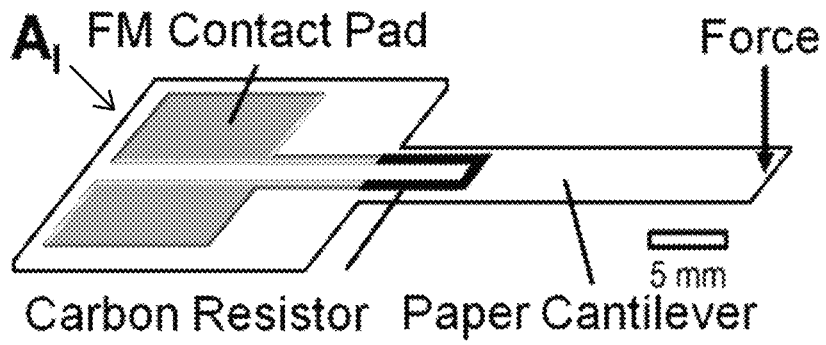
FIG. 11A is a schematic view of a MEMS device ($A_I$) fabricated using Field's metal LMSC particle-containing ink printed on a paper substrate that produces a sensor output of change in resistance (ΔR) versus force (F) applied on the paper cantilever.
Figure 11B:
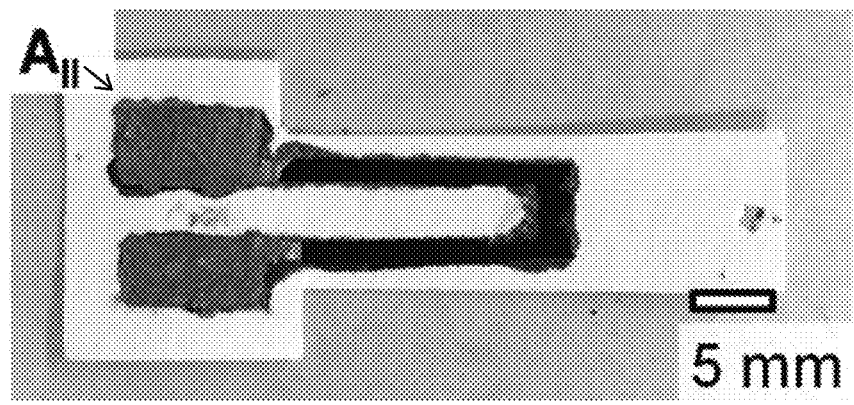
FIG. 11B is magnified image of the actual fabricated MEMS device ($A_{II}$) showing a 5 mm scale bar.

In particular, a MEMS device $A_1$ was fabricated on a paper substrate by hand. A schematic of the device can be seen in FIG. 11A where the "FM" contact pad is made of the Field's metal LMSC particle-containing ink instead of silver. FIG. 11B is an image of the actual MEMS device ($A_{II}$).

In particular, each microelectromechanical system (MEMS) device employed paper cantilever beam that was cut from Whatman® 3 mm chromatography paper. The cantilever was 50 mm in length and 15 mm in width. Carbon resistors were screen printed on the paper using a highly resistive graphite ink and the Field's metal particle contact pads were applied to the paper using a nail polishing brush and the 75 weight % Field's metal particle-containing ink. Chemical flux comprising HCl, water, and ethanol was then applied by dropper to the contact pads to initiate CUPACT (coalescence of undercooled particles by chemical trigger) reflow and interconnect the Field's metal particles to provide an electrically conductive contact pad.

The MEMS device fabricated as described was effective in producing a linear change of output resistance ($\Delta R$ in ohms) in response to application of force F (mN) on the cantilever. In fact, the MEMS device produced a higher sensitivity (change in output resistance) to applied force F of a higher magnitude as compared to a similar MEMS device made with silver conductive ink.

Example 10

Wheatstone Bridge

This example demonstrates practice of an embodiment of the invention to direct write electrically conductive interconnects of a Wheatstone bridge on a paper substrate.

Figure 12:
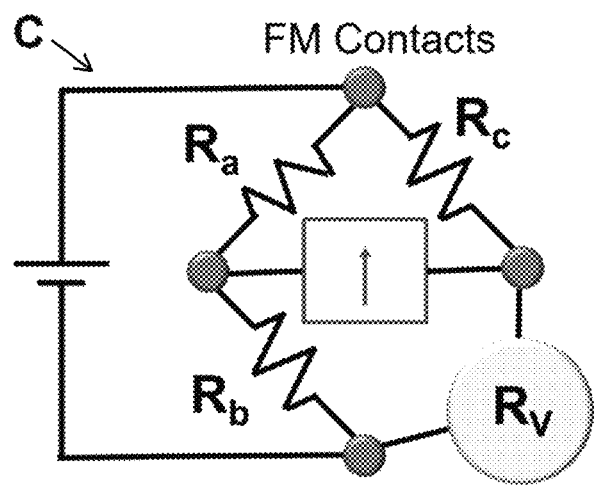
FIG. 12 is a schematic view of a Wheatstone bridge (C) that was fabricated by printing Field's metal LMSC particle-containing ink on a paper substrate where the LMSC particles were used as an electrically conductive solder (designated by gray circles) to join two known resistors Ra, Rb, a resistor Rc of unknown resistance, and a variable resistor Rv to produce a functioning Wheatstone bridge.

Referring to FIG. 12, a Wheatstone bridge circuit C was fabricated by direct writing of LMSC particle containing-ink interconnects on a paper substrate using a syringe and then using a chemical flux that was applied to the particles to release the liquid alloy core. All interconnects between the resistors Ra, Rb, Rc, and Rv were connected using the LMSC particles.

More particularly, the Wheatstone bridge included three 100 ohm resistors and a variable resistor. The substrate used for the Wheatstone bridge was white cardstock paper (Neenah® 40311 paper). Each of the resistors was connected in the circuit as shown in FIG. 11 using the 75 weight % Field's metal LMSC particle-containing ink described above.

A 9V battery was connected between the contacts of Rb-Rv and Ra-Rc, while a galvanometer (designated by the arrow) was connected between the contacts of Ra-Rb and Rc-Rv using PCB pin wires. Following connection, chemical flux is applied to each contact to initiate CUPACT and then dried in room temperature. The Wheatstone bridge was tested by changing the resistance at one of the contacts using the variable resistor Rv and using the galvanometer to detect the current flow through the circuit.

The Wheatstone bridge was fully functional.

From the above description of illustrative embodiments of the present invention, it will be apparent that practice of the invention has anticipated benefits that include the ability to incorporate higher-melting metal materials into heat-sensitive plastics without negatively affecting the geometry, color, or mechanical properties of the plastic. Typically, conductive inks of colloidal silver particle suspensions are applied in a viscous paste and then heat-treated to cure the ink and improve metal-to-metal electrical connections. Many plastics do not respond well during heat treatment, and they deform. The resulting metal/epoxy material is conductive, but not as conductive as solid metals, and it behaves mechanically like a cured epoxy. Some conductive inks can be used at room temperature but are costly.

The invention envisions the direct printing of integrated antennas, wiring, sensors, wearable devices, and batteries into or onto thermoplastics for numerous commercial, military, and aerospace applications. The invention can be used for commercial printing of embedded sensors, structural health monitoring panels, and imbedded wiring in automotive and aerospace applications. Use in the design and production of components for mission-specific unmanned aerial vehicles in days rather than years is envisioned. Moreover, the invention envisions direct printing of embedded sensors, structural health monitoring panels, and imbedded wiring in automotive and aerospace applications.

Although the present invention has been described above in detail above with respect to certain embodiments for purposes of illustration, those skilled in the art will appreciate the changes and modifications can be made therein within the scope of the present invention as set forth in the appended claims.

We claim:

1. A method of direct printing or writing of a metallic material, comprising:
   using a printing device or a writing device to deposit an ink comprising undercooled liquid metallic core-shell particles dispersed in a carrier fluid on a substrate surface as one or more layers, the undercooled liquid metallic core-shell particles comprising a liquid metallic core material;
   wherein
   the substrate surface comprises a thermoplastic material, a thermoset material, an amorphous material, a porous material, a fibrous material, or a combination thereof, or
   the carrier fluid comprises a cellulose solution, or
   a combination thereof.

2. The method of claim 1 including relatively moving the substrate surface and the printing or writing device to deposit the undercooled liquid metallic core-shell particles on the substrate surface.

3. The method of claim 1 including the additional step of releasing the liquid metallic core material of the undercooled liquid metallic core-shell particles and solidifying the released liquid metallic material as one or more metallic layers on the substrate surface.

4. The method of claim 3 wherein the one or more metallic layers is/are electrically conductive.

5. The method of claim 1 wherein the one or more layers is/are thermally conductive.

6. The method of claim 1 where the one or more layers is/are continuous, porous or discontinuous.

7. The method of claim 1 wherein the one or more layers form one or more straight or curvilinear electrically conductive lines.

8. The method of claim 7 wherein the lines are laterally spaced apart on the substrate surface.

9. The method of claim 7 where the lines are orthogonally positioned.

10. The method of claim 7 where the lines intersect at an angle.

11. The method of claim 7 wherein the lines are disposed one atop the other as a 3-D line.

12. The method of claim 1 wherein the writing device comprises a writing pen.

13. The method of claim 1 wherein the writing device comprises a printer.

14. The method of claim 1 where in the writing device is a tube through which the ink flows out.

15. The method of claim 14 where the tube communicates with a pump to provide a microfluidic delivery system.

16. The method of claim 13 where a flow focus nozzle is attached to the tube.

17. The method of claim 3 wherein the liquid metallic core material is released by removing at least part of a particle shell of at least some of the undercooled liquid metallic core-shell particles.

18. The method of claim 17 including using a chemical flux to release the metallic core material from the undercooled liquid metallic core-shell particles by removing at least part of a particle shell of at least some of the undercooled liquid metallic core-shell particles.

19. The method of claim 3 including mechanically fracturing at least some of the particle to release the metallic core material.

20. The method of claim 19 where a fracture force is applied using the printing device or the writing device.

21. The method of claim 19 where the fracture force is applied using a tool that includes at least one of a roller, a press, and a blunt object.

22. The method of claim 3 including using light impingement to at least release the metallic core material from the undercooled liquid metallic core-shell particles by removing at least part of a particle shell of at least some of the undercooled liquid metallic core-shell particles.

23. The method of claim 22 wherein the light is a laser.

24. The method of claim 22 wherein the light is a focused beam.

25. The method of claim 3 including using ultrasound to release the metallic core material from the undercooled liquid metallic core-shell particles by removing at least part of a particle shell of at least some of the undercooled liquid metallic core-shell particles.

26. The method of claim 3 including using vibration to release the metallic core material from the undercooled liquid metallic core-shell particles by removing at least part of a particle shell of at least some of the undercooled liquid metallic core-shell particles.

27. The method of claim 3 including using heat to release the metallic core material from the undercooled liquid metallic core-shell particles by fracturing at least part of a particle shell of at least some of the undercooled liquid metallic core-shell particles.

28. The method of claim 1 wherein the substrate surface comprises a polymer or gel.

29. The method of claim 1 wherein the substrate surface comprises a thermoplastic material.

30. The method of claim 1 wherein the substrate surface comprises a thermoset material.

31. The method of claim 1 wherein the substrate surface comprises a glass material.

32. The method of claim 1 wherein the substrate surface comprises a metal material.

33. The method of claim 1 wherein the substrate surface comprises a composite material.

34. The method of claim 1 wherein the substrate surface comprises a ceramic material.

35. The method of claim 1 wherein the substrate surface comprises a crystalline material.

36. The method of claim 1 wherein the substrate surface comprises an amorphous material.

37. The method of claim 1 wherein the substrate surface comprises a porous material.

38. The method of claim 1 wherein the substrate surface comprises a fibrous material.

39. The method of claim 1 wherein the one or more layers have a shape of a contact pad or touch pad.

40. The method of claim 1, further comprising forming an electronic device that comprises the substrate surface, wherein the one or more layers comprise electrically interconnected, solidified metallic particle material.

41. The method of claim 40, wherein the electronic device comprises at least one of a LED device, a MEMS device, a capacitance touch sensor, and a Wheatstone bridge.

42. The method of claim 1 wherein the substrate surface is a flexible substrate surface.

43. The method of claim 1 wherein the core-shell particles each comprise a liquid metallic core within an outer oxide shell.

44. The method of claim 1 wherein the carrier fluid is a cellulose solution.

* * * * *

UNITED STATES PATENT AND TRADEMARK OFFICE
CERTIFICATE OF CORRECTION

PATENT NO. : 11,059,098 B2
APPLICATION NO. : 15/932990
DATED : July 13, 2021
INVENTOR(S) : Thuo et al.

It is certified that error appears in the above-identified patent and that said Letters Patent is hereby corrected as shown below:

On the Title Page

On page 2, in Column 1, under "Other Publications", Line 33, delete ""Self-Asembly" and insert --"Self-Assembly-- therefor On page 2, in Column 2, under "Other Publications", Line 2, delete "microindentaiton" and insert --microindentation-- therefor On page 2, in Column 2, under "Other Publications", Line 44, delete ""Nanwire" and insert --"Nanowire-- therefor On page 3, in Column 1, under "Other Publications", Line 15, delete "acorss" and insert --across-- therefor On page 3, in Column 2, under "Other Publications", Line 9, delete "bsed" and insert --based-- therefor On page 3, in Column 2, under "Other Publications", Line 4, delete ""Si/SiO2-Templated" and insert --"Si/SiO$_2$-Templated-- therefor In the Specification In Column 4, Line 17, delete "LMSC" and insert --LMCS-- therefor In Column 4, Line 24, delete "LMSC" and insert --LMCS-- therefor In Column 4, Line 28, delete "LMSC" and insert --LMCS-- therefor In Column 4, Line 31, delete "LMSC" and insert --LMCS-- therefor Signed and Sealed this
Fifth Day of October, 2021

Drew Hirshfeld
*Performing the Functions and Duties of the
Under Secretary of Commerce for Intellectual Property and
Director of the United States Patent and Trademark Office*

In Column 4, Line 41, delete "LMSC" and insert --LMCS-- therefor

In Column 4, Line 42, delete "LMSC" and insert --LMCS-- therefor

In Column 4, Line 44, delete "Ra, Rb," and insert --$R_a$, $R_b$,-- therefor

In Column 4, Line 45, delete "Rc" and insert --$R_c$-- therefor

In Column 4, Line 45, delete "Rv" and insert --$R_v$-- therefor

In Column 6, Line 57, delete "LMSC" and insert --LMCS-- therefor

In Column 7, Line 29, delete "LMSC" and insert --LMCS-- therefor

In Column 8, Line 38, delete "LMSC" and insert --LMCS-- therefor

In Column 9, Line 42, delete "LMSC" and insert --LMCS-- therefor

In Column 9, Line 50, delete "LMSC" and insert --LMCS-- therefor

In Column 9, Line 57, delete "LMSC" and insert --LMCS-- therefor

In Column 9, Line 62, delete "LMSC" and insert --LMCS-- therefor

In Column 10, Line 3, delete "LMSC" and insert --LMCS-- therefor

In Column 10, Line 13, delete "LMSC" and insert --LMCS-- therefor

In Column 10, Line 18, delete "LMSC" and insert --LMCS-- therefor

In Column 10, Line 20, delete "LMSC" and insert --LMCS-- therefor

In Column 10, Line 21, delete "LMSC" and insert --LMCS-- therefor

In Column 10, Line 31, delete "LMSC" and insert --LMCS-- therefor

In Column 10, Line 44, delete "LMSC" and insert --LMCS-- therefor

In Column 11, Line 4, delete "LMSC" and insert --LMCS-- therefor

In Column 11, Line 6, delete "LMSC" and insert --LMCS-- therefor

In Column 11, Line 28, delete "LMSC" and insert --LMCS-- therefor

In Column 11, Line 59, delete "LMSC" and insert --LMCS-- therefor

CERTIFICATE OF CORRECTION (continued)
U.S. Pat. No. 11,059,098 B2

In Column 11, Line 63, delete "Ra, Rb, Rc, and Rv" and insert --$R_a$, $R_b$, $R_c$, and $R_v$-- therefor In Column 11, Line 64, delete "LMSC" and insert --LMCS-- therefor In Column 12, Line 3, delete "LMSC" and insert --LMCS-- therefor In Column 12, Line 5, delete "Rb-Rv and Ra-Rc," and insert --$R_b$-$R_v$ and $R_a$-$R_c$,-- therefor In Column 12, Lines 6-7, delete "Ra-Rb and Rc-Rv" and insert --$R_a$-$R_b$ and $R_c$-$R_v$-- therefor In Column 12, Line 11, delete "Rv" and insert --$R_v$-- therefor